United States Patent
Heo et al.

(10) Patent No.: US 9,544,985 B2
(45) Date of Patent: Jan. 10, 2017

(54) APPARATUS AND SYSTEM FOR GENERATING EXTREME ULTRAVIOLET LIGHT AND METHOD OF USING THE SAME

(71) Applicants: Jin-Seok Heo, Suwon-si (KR); Jin-Hong Park, Yongin-si (KR)

(72) Inventors: Jin-Seok Heo, Suwon-si (KR); Jin-Hong Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 14/803,920

(22) Filed: Jul. 20, 2015

(65) Prior Publication Data

US 2016/0143122 A1 May 19, 2016

(30) Foreign Application Priority Data

Nov. 19, 2014 (KR) .................. 10-2014-0161941

(51) Int. Cl.
| | |
|---|---|
| A61N 5/06 | (2006.01) |
| H05G 2/00 | (2006.01) |
| G21K 1/06 | (2006.01) |
| G03F 7/20 | (2006.01) |
| B05B 12/12 | (2006.01) |

(52) U.S. Cl.
CPC ............. *H05G 2/008* (2013.01); *B05B 12/12* (2013.01); *G03F 7/70033* (2013.01); *G21K 1/067* (2013.01); *H05G 2/005* (2013.01)

(58) Field of Classification Search
CPC ............ H05G 1/38; H05G 1/52; H05G 2/001; H05G 2/003; H05G 2/005; H05G 2/006; H05G 2/008; H05H 1/0012

USPC .......................................... 250/504 R, 493.1
See application file for complete search history.

(56) References Cited

U.S. PATENT DOCUMENTS

| | | | |
|---|---|---|---|
| 5,980,490 A * | 11/1999 | Tsoukalis | F04B 43/082 |
| | | | 417/474 |
| 7,060,993 B2 | 6/2006 | Wedowski et al. | |
| 7,116,394 B2 | 10/2006 | Bakker et al. | |
| 7,518,128 B2 | 4/2009 | Van Herpen et al. | |
| 7,705,334 B2 | 4/2010 | Yabuta et al. | |
| 8,125,617 B2 | 2/2012 | Woo et al. | |
| 8,242,471 B2 | 8/2012 | Soer et al. | |
| 8,419,862 B2 | 4/2013 | Ehm et al. | |
| 8,586,954 B2 | 11/2013 | Asayama et al. | |
| 2009/0127479 A1* | 5/2009 | Hosokai | B82Y 10/00 |
| | | | 250/504 R |
| 2010/0039632 A1 | 2/2010 | Van Herpen et al. | |
| 2010/0051827 A1* | 3/2010 | Derra | B82Y 10/00 |
| | | | 250/492.1 |

(Continued)

FOREIGN PATENT DOCUMENTS

| | | |
|---|---|---|
| JP | 2009-016640 | 1/2009 |
| JP | 2010-010380 | 1/2010 |

*Primary Examiner* — Jason McCormack
(74) *Attorney, Agent, or Firm* — Myers Bigel & Sibley, PA

(57) ABSTRACT

Provided is an apparatus for generating extreme ultraviolet light. The apparatus includes a collector mirror unit, a gas supply unit configured to supply a processing gas to the collector mirror unit, a gas supply nozzle arranged in at least one area of the collector mirror unit and configured to supply the processing gas to a surface of the collector mirror unit, and a controller configured to adjust a shape of a spray hole of the gas supply nozzle. The shape of the spray hole may be changed according to a control operation of the controller.

20 Claims, 16 Drawing Sheets

(56) References Cited

U.S. PATENT DOCUMENTS

| | | | |
|---|---|---|---|
| 2010/0176312 A1 | 7/2010 | Komori et al. | |
| 2011/0270288 A1* | 11/2011 | Stergiopulos | A61B 17/12 606/158 |
| 2014/0216576 A1* | 8/2014 | Someya | H05G 2/008 137/560 |
| 2014/0306115 A1* | 10/2014 | Kuritsyn | G02B 27/0006 250/358.1 |

* cited by examiner

<u>1</u>

<u>3</u>

5

APPARATUS AND SYSTEM FOR GENERATING EXTREME ULTRAVIOLET LIGHT AND METHOD OF USING THE SAME

CROSS-REFERENCE TO RELATED APPLICATION

This application claims priority under 35 U.S.C. 119 from Korean Patent Application No. 10-2014-0161941, filed on Nov. 19, 2014, the entire contents of which are hereby incorporated herein by reference.

BACKGROUND

The present inventive concept relates to an apparatus and system for generating extreme ultraviolet light, and a method of using the same.

Recently, a lithography process, which uses extreme ultraviolet light in order to minutely process a semiconductor device, is being suggested. The lithography process is a process which reduces and projects light or beam(s) on a silicon substrate through a mask where a circuit pattern has been drawn and forms an electric circuit by photosensitizing photoresist materials.

The minimum process value of the circuit, which is formed by the optical lithography process, depends on the wavelength of the light source. Hence, in the optical lithography process for processing a semiconductor device, the light source needs to provide light having a short wavelength. As the next-generation lithography light source, the extreme ultraviolet (EUV) light source is appropriate. The extreme ultraviolet light has the wavelength of about 1 to 100 nm. The extreme ultraviolet light has a high absorption rate for all materials, and thus it is difficult to use a transmitting type optical system such as a lens and a reflection type optical system is used.

The light source plasma is generated through a light source plasma generation by a laser irradiation scheme (laser produced plasma (LPP)) or a light source plasma generation by a gas discharge scheme operated by a pulse power technology (discharge produced plasma (DPP)).

SUMMARY

The present inventive concept provides an apparatus for generating extreme ultraviolet light including a variable nozzle capable of providing flexible processing gas to a concentrator based on the result of analysis on Tin contamination patterns without uniformly processing Tin contamination patterns which are differently shown according to the setup state of the apparatus in the concentrator within the apparatus for generating the extreme ultraviolet light.

The present inventive concept further provides a system for generating extreme ultraviolet light including a variable nozzle capable of providing flexible processing gas to a concentrator based on the result of analysis on Tin contamination patterns without uniformly processing Tin contamination patterns which are differently shown according to the setup state of the apparatus in the concentrator within the apparatus for generating the extreme ultraviolet light. The present inventive concept further provides a method of using an apparatus for generating extreme ultraviolet light capable of providing flexible processing gas to a concentrator based on the result of analysis on Tin contamination patterns without uniformly processing Tin contamination patterns which are differently shown according to the setup state of the apparatus in the concentrator within the apparatus for generating the extreme ultraviolet light.

In accordance with an aspect of the present inventive concept, there is provided an apparatus for generating extreme ultraviolet light including a collector mirror unit, a gas supply unit configured to supply a processing gas to the collector mirror unit, a gas supply nozzle arranged in at least one area of the collector mirror unit and configured to supply the processing gas to a surface of the collector minor unit, and a controller configured to adjust a shape of a spray hole of the gas supply nozzle, wherein the shape of the spray hole is changed according to a control operation of the controller.

In accordance with another aspect of the present inventive concept, there is provided an apparatus for generating extreme ultraviolet light. The apparatus includes: a collector mirror unit; a gas supply unit configured to supply a processing gas to the collector mirror unit; a peripheral gas supply nozzle arranged at a peripheral area of the collector minor unit and configured to supply the processing gas inwardly along a surface of the collector minor unit; a sensing unit configured to measure a contamination level of the surface of the collector minor unit; and a controller configured to adjust a shape of a spray hole of the peripheral gas supply nozzle in response to the measured contamination level.

In accordance with another aspect of the present inventive concept, there is provided an apparatus for generating extreme ultraviolet light including a vessel, a light source configured to supply a source light to an inside of the vessel, a droplet generation unit configured to supply a droplet to the source light which is provided to the inside of the vessel, a collector mirror unit arranged within the vessel and configured to collect and reflect extreme ultraviolet light which is generated by reaction between the source light and the droplet, a gas supply unit configured to supply processing gas to the collector mirror unit, a first gas supply nozzle arranged in a peripheral area of the collector mirror unit and configured to supply the processing gas toward a center area of the collector mirror unit, a second gas supply nozzle arranged in the center area of the collector mirror unit and configured to supply the processing gas therethrough, and a controller configured to adjust a shape of at least one of a first spray hole of the first gas supply nozzle and a second spray hole of the second gas supply nozzle.

In accordance with still another aspect of the present inventive concept, there is provided a system for generating extreme ultraviolet light including an apparatus for generating extreme ultraviolet light, and a gas supply nozzle configured to supply a processing gas to a surface of an object which is included in the apparatus for generating the extreme ultraviolet light, wherein a shape of a spray hole of the gas supply nozzle is variable.

In accordance with still another aspect of the present inventive concept, there is provided a method of using an apparatus for generating extreme ultraviolet light including sensing a contamination level of a surface of a collector mirror unit, determining a processing gas flow by analyzing the contamination level, changing a shape of a gas supply nozzle which has been installed in the collector mirror unit, and supplying the processing gas to the collector mirror unit.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
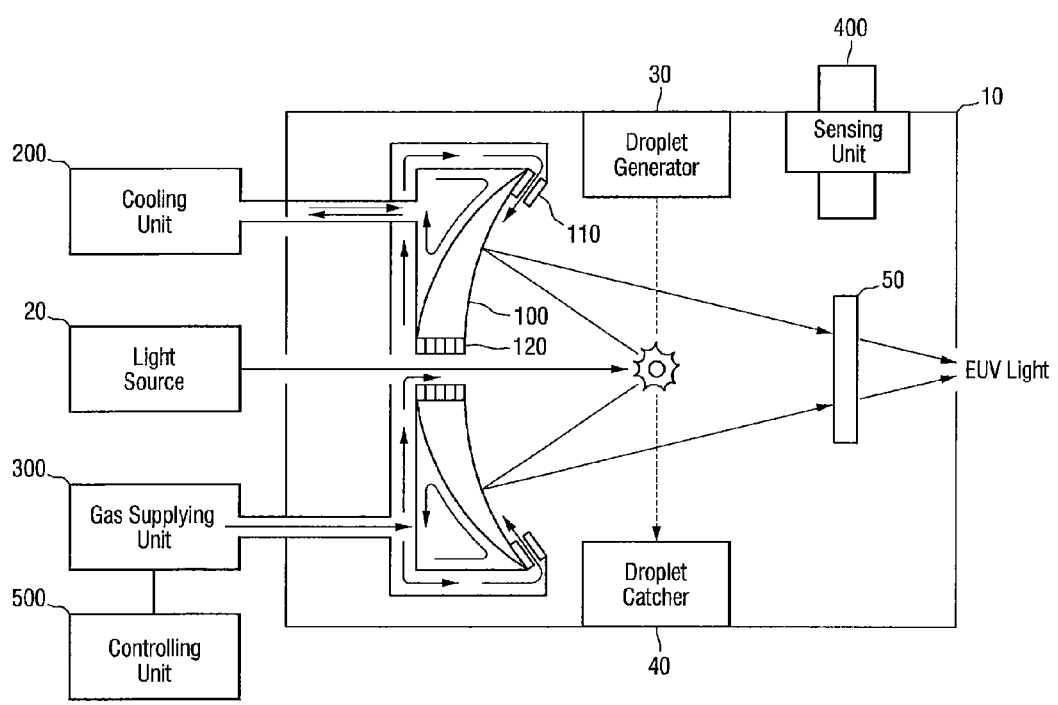
FIG. 1 is a block diagram schematically illustrating an apparatus for generating extreme ultraviolet light according to an embodiment of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached figures, certain elements or features may be exaggerated for clarity.

It will also be understood that when an element is referred to as being "on" another element, it can be directly on the other element, or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries are not to be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

An apparatus for generating extreme ultraviolet light according to an embodiment of the present inventive concept will be described with reference to FIGS. 1 to 3.

FIG. 1 is a block diagram schematically illustrating an apparatus for generating extreme ultraviolet light according to an embodiment of the present inventive concept. FIG. 2 is a perspective view of a collector mirror unit of FIG. 1. FIG. 3 is a cross-sectional view cut or taken along line A-A' of FIG. 2.

Referring to FIG. 1, an apparatus for generating extreme ultraviolet light according to an embodiment of the present inventive concept generates extreme ultraviolet light by using chemical reaction inside the vessel 10. A droplet generator 30 which provides a droplet (d) and a droplet catcher 40 which accommodates a droplet which is provided in one direction are arranged inside the vessel 10.

The droplet may contain at least one of tin Sn, lithium Li, and xenon Xe. Specifically, the droplet may be a cluster or gas of tin Sn, lithium Li, and xenon Xe, etc. The pressure of the space, where the droplet is provided, may be preferably about 1m bar.

The light source 20 provides the first light. That is, the first light, which is provided by the light source 20, generates extreme ultraviolet light by interaction with the droplet. The first light, which is provided by the light source 20, may be provided as the droplet within the vessel 10 along a plurality of reflective mirrors. The first light may be, for example, $CO_2$ laser. Especially, the first light may have a high pulse of 40 kHz or more and may be $CO_2$ laser which oscillates with the wavelength of 9.3 μm or 10.6 μm.

A collector mirror unit 100 is arranged at one surface of the vessel 10. A hole is formed in the center part of the collector mirror unit 100 so that the first light, which is provided from the light source 20, may be provided to the inside of the vessel 10. The droplet, which is provided from the droplet generator 30, generates extreme ultraviolet light in reaction with the first light. The collector mirror unit 100 may concentrate extreme ultraviolet light on the focusing lens 50 by collecting and reflecting the generated extreme ultraviolet light and discharge the extreme ultraviolet light to the outside of the vessel 10. Such generated extreme ultraviolet light may be used in the exposure device of the lithography process.

At this time, the reflectance of the collector mirror unit 100 affects the strength of the discharged extreme ultraviolet light, and thus it is important to maintain the collector mirror unit 100 in a clean state. However, if the apparatus for generating extreme ultraviolet light is used for a long time, the collector mirror unit 100 within the vessel 10 is contaminated by the droplet deposits. The reflectance of the contaminated collector mirror unit 100 is lowered, thereby lowering the output of the discharged extreme ultraviolet light. Hence, in order to prevent the contamination of the surface of the collector mirror unit 100, the processing gas (e.g., $H_2$ gas) needs to be provided to the surface of the collector mirror unit 100 through the gas supply unit 300. Such processing gas (e.g., $H_2$ gas) may form an air curtain on the surface of the collector mirror unit 100 so as to prevent the droplet deposits from being stacked on the surface of the collector mirror unit 100. However, despite such an air curtain, the surface of the collector mirror unit 100 may be contaminated, and the droplet deposits, which have been stacked in the collector mirror unit 100 by the processing gas (e.g., $H_2$ gas) may need to be removed.

The contaminated area of the surface of the collector mirror unit 100 may be non-uniformly formed. Hence, if the processing gas (e.g., $H_2$ gas) is uniformly provided to the surface of the collector mirror unit 100, the contaminated area may remain in a partial area of the collector mirror unit 100, and the amount of the flow of the processing gas (e.g., $H_2$ gas) may need to be increased in some area of the collector mirror unit 100. In the present inventive concept, the processing gas (e.g., $H_2$ gas) may be provided through a spray hole having a variable shape so that the processing gas (e.g., $H_2$ gas) of a different flow may be provided according to the level of contamination of the contaminated area of the collector mirror unit 100.

Figure 2:
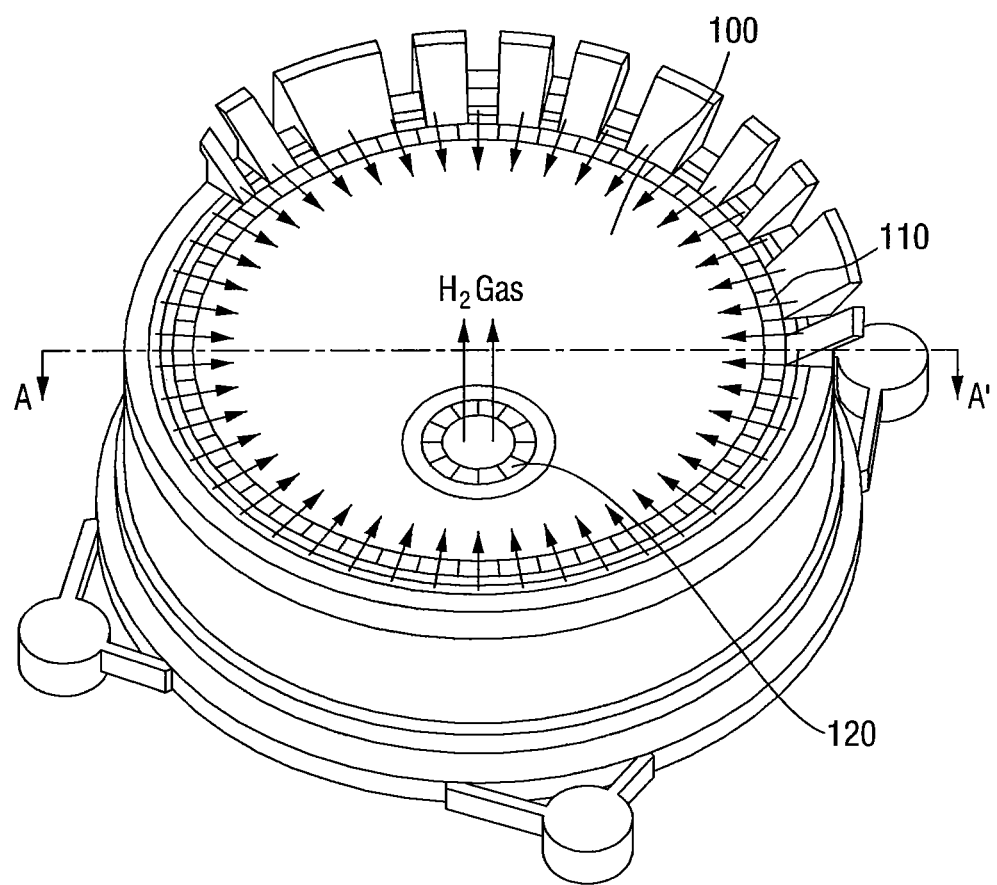
FIG. 2 is a perspective view of a collector mirror unit of FIG. 1.
Figure 3:
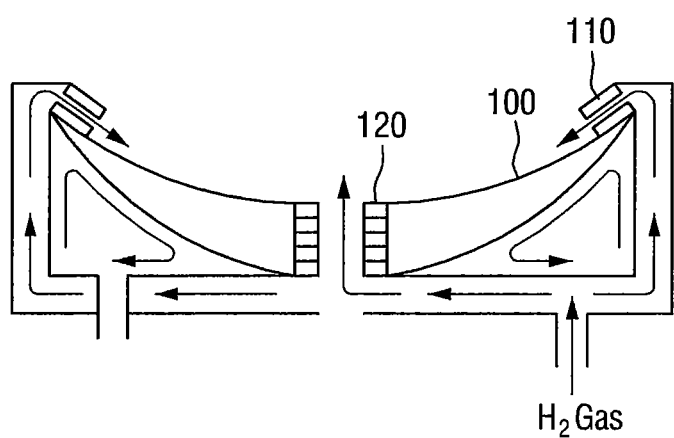
FIG. 3 is a cross-sectional view taken along line A-A' of FIG. 2.

With reference to FIGS. 1 to 3, the apparatus for generating extreme ultraviolet light according to an embodiment of the present inventive concept will be described in more detail.

The apparatus for generating extreme ultraviolet light according to an embodiment of the present inventive concept includes a vessel 10, a light source 20, a droplet generator 30, a droplet catcher 40, a focusing lens 50, a collector mirror unit 100, a peripheral nozzle 110, a center nozzle 120, a cooling unit 200, a gas supply unit 300, a sensing unit 400, and a controller 500.

The vessel 10 is a space which accommodates devices for generating extreme ultraviolet light and is a space which generates extreme ultraviolet light by reaction between the droplet and the first light which is supplied from the light source 20. The droplet generator 30 and the droplet catcher 40 may be arranged at the inside of the vessel 10 and the collector mirror unit 100 may be arranged at the back surface of the vessel 10. The sensing unit 400 may be arranged at one surface of the vessel 10 so as to measure the contamination level of the collector mirror unit 100. The vessel 10 may define a substantially closed space. However, a hole for entrance and exit of light may be formed in at least one surface of the vessel 10.

The light source 20 supplies the first light. Here, the first light may be, for example, $CO_2$ laser. In particular, the first light may be $CO_2$ laser which has a high pulse of 40 kHz or more and oscillates with the wavelength of 9.3 μm or 10.6 μm. The first light, which is supplied by the light source 20, generates extreme ultraviolet light by reaction with the droplet which is supplied from the droplet generator 30.

The droplet generator 30 supplies the droplet to the inside of the vessel 10. For example, the droplet generator 30 may be arranged at one surface of the vessel 10 so as to supply the droplet to the other surface of the vessel 10. Here, one surface of the vessel 10 may face the other surface.

The droplet catcher 40 may be arranged at the other surface of the vessel 10 so as to accommodate the droplet which is supplied from the droplet generator 30. The droplet, which is supplied to the inside of the vessel 10, may generate extreme ultraviolet light by reaction with the first light which is supplied from the light source 20. Hence, the droplet may contain at least one of tin Sn, lithium Li, and xenon Xe. Specifically, the droplet may be a cluster or gas of tin Sn, lithium Li, and xenon Xe, etc.

The focusing lens 50 may be arranged at the inside of the vessel 10 so as to concentrate extreme ultraviolet light which has been generated by reaction between the droplet and the first light and discharge extreme ultraviolet light to the outside of the vessel 10.

The collector mirror unit 100 may be arranged at, for example, the back surface of the vessel 10 so as to collect and reflect extreme ultraviolet light which has been generated by reaction between the droplet and the first light. At this time, extreme ultraviolet light reaches the collector mirror unit 100 so as to be reflected, and thus the temperature of the collector mirror unit 100 may increase. Hence, the cooling unit 200 may be arranged at one surface of the collector mirror unit 100 so as to adjust the temperature of the collector mirror unit 100.

The cooling unit 200 supplies cooling water to one surface of the collector mirror unit 100. The cooling water may be supplied to one surface of the collector mirror unit 100 along the cooling line from the storage tank of the cooling unit 200 which is arranged at the outside of the vessel 10. The cooling water is operated to be circulated within the cooling unit 200, and the cooling unit 200 has a closed space so as to prevent the leakage of the cooling water to the outside.

The gas supply unit 300 supplies processing gas (e.g., $H_2$ gas) to one surface of the collector mirror unit 100. The processing gas (e.g., $H_2$ gas), which is supplied from the gas supply unit 300, is supplied in the center direction of the collector mirror unit 100 (e.g., toward the center of the collector mirror unit 100) by the peripheral nozzle which is arranged in the peripheral area of the collector mirror unit 100. Further, the processing gas (e.g., $H_2$ gas), which is supplied from the gas supply unit 300, is supplied in the vertical direction of the collector mirror unit 100 by the center nozzle 120 which has been arranged in the center area of the collector mirror unit 100. That is, the center nozzle 120 supplies the processing gas in a direction away from the collector mirror unit 100 (e.g., in a direction normal to or orthogonal to the center of the collector mirror unit). Here, the shape of the spray hole of the peripheral nozzle 110 and the center nozzle 120 may be changed according to the control operation.

In the conventional apparatus for generating the extreme ultraviolet light, the shape of the spray hole of the nozzle, which supplies the processing gas (e.g. $H_2$ gas) to the collector mirror unit 100, has been fixed, and the processing gas (e.g. $H_2$ gas) is supplied with the same amount of flow to the collector mirror unit 100. It has been confirmed by an experiment that the droplet deposits within or on the collector mirror unit 100 cannot be completely removed only by increasing the flow of the processing gas (e.g., $H_2$ gas). This is because the amounts of the droplet deposits that have been stacked in areas in the collector mirror unit 100 are different. Further, a multiple of droplet deposits remain in some areas of the collector mirror unit 100, thereby lowering the efficiency of the light reflection of the extreme ultraviolet ray.

According to the present inventive concept, the processing gas (e.g., $H_2$ gas) of an appropriate amount of flow may be actively supplied by checking the contamination level of the droplet deposits within or on the collector mirror unit 100.

The sensing unit 400 is arranged at one surface within the vessel 10 and senses the contamination level of the collector mirror unit 100. The sensing unit 400 may measure the distribution of the contamination level of the collector mirror unit 100 which may be made as an image, through which the user may change the shape of the spray shape of the peripheral nozzle or the center nozzle 120 which has been arranged in the collector mirror unit 100 so as to adjust the amount of flow of the processing gas (e.g., $H_2$ gas) which has been supplied to the collector mirror unit 100.

The controller 500 changes the shape of the spray hole or passageway of the peripheral nozzle 110 or the center nozzle 120. That is, the shape of the spray hole of the peripheral nozzle 110 or the center nozzle 120 may be adjusted according to the control operation of the controller 500.

Further, the controller 500 may use feedback from the result of measuring the contamination level of the sensing unit 400 so as to adjust change the shape of the spray hole of the peripheral nozzle 110 or the center nozzle 120. Such control operation of the controller 500 may be automatically or manually operated.

Hereinafter, the shape of the spray hole or passageway of the peripheral nozzle 110 and the center nozzle 120 according to some embodiments of the present inventive concept will be described.

First, the shape of the spray hole of the peripheral nozzle 110 will be described.

Figure 4:
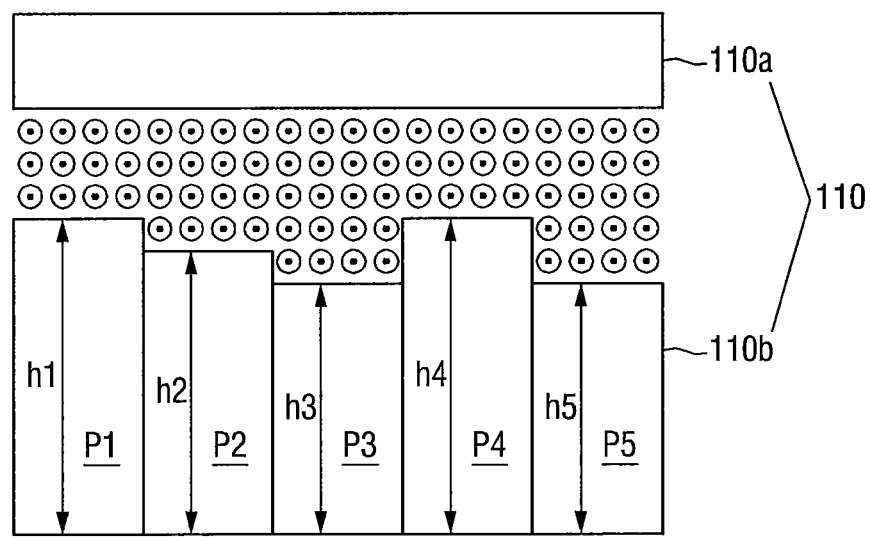
FIG. 4 is a cross-sectional view schematically illustrating a peripheral nozzle according to an embodiment of the present inventive concept.

FIG. 4 is a cross-sectional view schematically illustrating a peripheral nozzle according to an embodiment of the present inventive concept.

Referring to FIG. 4, the peripheral nozzle 110 according to an embodiment of the present inventive concept may be formed to include a plurality of spray holes or passageways. The peripheral nozzle 110 may include a first or upper unit 110a and a second or lower unit 110b. At this time, the lower unit 110b may be composed of first $n^{th}$ pillar units or members which may be respectively controlled independently. Here, "n" refers to a natural number of 2 or more, and FIG. 4 illustrates a case where n is 5, but the embodiment is not limited thereto.

The shapes of the plurality of spray holes of the peripheral nozzle 110 may be different according to respective heights h1 to h5 of the first to fifth pillar units P1 to P5 which form the lower unit 110b. That is, respective heights of the first to the fifth pillar units P1 to P5 may be independently controlled, and the height of the pillar unit may be lowered in the area where the amount of flow of the processing gas (e.g., $H_2$ gas) needs to be increased. Respective heights h1 to h5 of the first to fifth pillar units P1 to P5 may be controlled by using one or more actuators.

In other words, the pillar units P1 to P5 may be advanced toward and away from the first or upper unit 110a to adjust the shape of the spray hole (or the shapes of the plurality of spray holes). The controller 500 may be configured to independently move the pillar units P1 to P5 away from and toward the first or upper unit 110a, for example, in response to the contamination level as measured by the sensing unit 400.

In the area where the height of the pillar unit has been lowered, the area of the srpay hole relatively increases, and the amount of flow of the supply of the processing gas (e.g., $H_2$ gas) may increase. In the area where the contamination level of the droplet deposits is high for the collector mirror unit 100, the height of the pillar unit is lowered so as to increase the area of the pillar hole of the peripheral nozzle 110. The direction illustrated in FIG. 4 is the direction in which the processing gas (e.g., $H_2$ gas) is discharged (e.g., into and out of the paper), and the number of displayed circles refers to the relative amount of flow of the processing gas (e.g., $H_2$ gas). The meaning of the direction in which the processing gas is discharged and the number of circles is the same in the below description.

Figure 5:
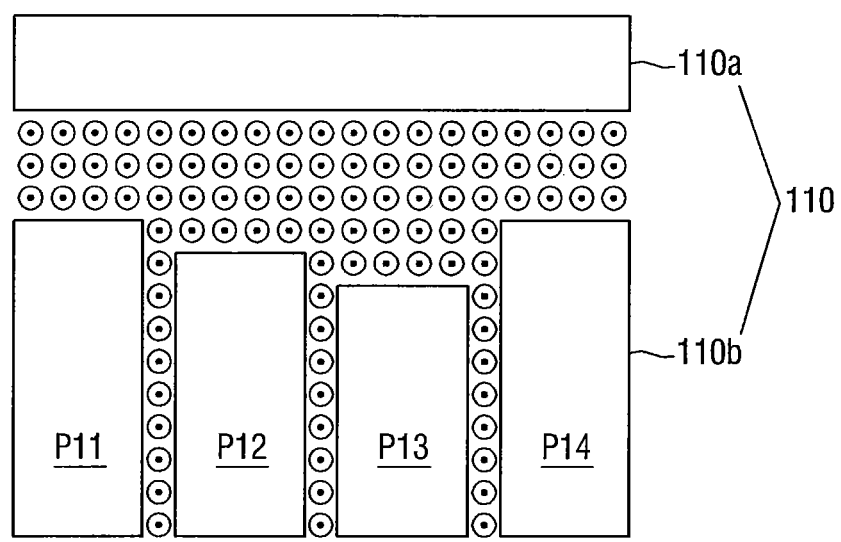
FIG. 5 is a cross-sectional view schematically illustrating a peripheral nozzle according to another embodiment of the present inventive concept.

FIG. 5 is a cross-sectional view schematically illustrating a peripheral nozzle according to another embodiment of the present inventive concept. What has already been described with reference to the peripheral nozzle according to an embodiment of the present inventive concept will be omitted here for the convenience of explanation and in the interest of brevity.

Referring to FIG. 5, a peripheral nozzle 110 according to another embodiment of the present inventive concept may include a first or upper unit 110a and a second or lower unit 110b. At this time, the lower unit 110b may be composed of first to $n^{th}$ pillar units or members which may be respectively controlled independently. FIG. 5 illustrates a case where "n" is 4, but the embodiment is not limited thereto.

The shapes of the plurality of spray holes of the peripheral nozzle 110 may be differently formed according to respective heights of the first to fourth pillar units P11 to P14 which form the lower unit 110b. That is, the respective heights of the first to fourth pillar units P11 to P14 may be independently controlled, and the height of the pillar unit may be lowered in the area where the amount of flow of the processing gas (e.g., $H_2$ gas) may need to be increased. Respective heights of the first to fourth pillar units P11 to P14 may be controlled by using one or more actuators.

Further, the first to fourth pillar units P11 to P14 may be placed away or spaced apart from each other. That is, when respective heights of the first to fourth pillar units P11 to P14 are adjusted, the wear by friction between neighboring pillar units is prevented, and the first to fourth pillar units P11 to P14 may be placed away from each other in order to help prevent the contamination of the collector mirror unit 100 as the particles, which may be generated by the friction between the neighboring pillar units, contact the collector mirror unit 100.

Figure 6:
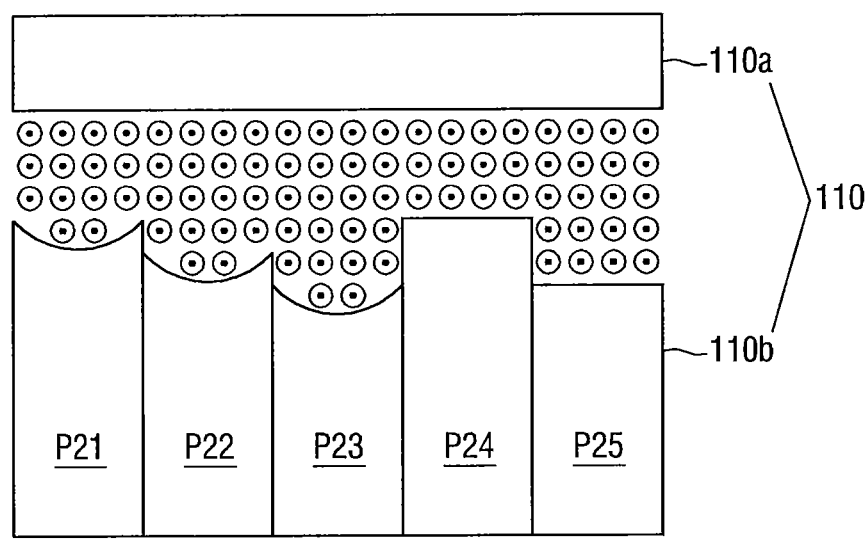
FIG. 6 is a cross-sectional view schematically illustrating a peripheral nozzle according to another embodiment of the present inventive concept.

FIG. 6 is a cross-sectional view schematically illustrating a peripheral nozzle according to another embodiment of the present inventive concept. What has already been described with reference to the peripheral nozzle according to an embodiment of the present inventive concept will be omitted here for the convenience of explanation and in the interest of brevity.

Referring to FIG. 6, a peripheral nozzle 110 according to another embodiment of the present inventive concept may include a first or upper unit 110a and a second or lower unit 110b. At this time, the lower unit 110b may be composed of first to $n^{th}$ pillar units or members which may be respectively controlled independently. FIG. 6 illustrates a case where "n" is 5, but the embodiment is not limited thereto.

The shapes of the plurality of spray holes of the peripheral nozzle 110 may be differently formed according to respective heights of the first to fifth pillar units P21 to P25 which form the lower unit 110b. That is, the respective heights of the first to fifth pillar units P21 to P25 may be independently controlled, and the height of the pillar unit may be lowered in the area where the amount of flow of the processing gas (e.g., $H_2$ gas) may need to be increased. Respective heights of the first to fifth pillar units P21 to P25 may be controlled by using one or more actuators.

Further, the shapes of the upper surfaces of the first to fifth pillar units P21 to P25 may be differently formed. For example, the upper surfaces of the first to third pillar units P21 to P23 may be curved or curve-shaped, and the upper surfaces of the fourth to fifth pillar units P24 and P25 may be flat, straight or straight-shaped. As the upper surface of the pillar unit becomes curve-shaped, the area of the spray hole may relatively increase, and even if the height of the pillar unit is not adjusted, the amount of flow of the processing gas (e.g., $H_2$ gas) may relatively increase.

Referring to FIG. 6, it is understood that the area of the spray hole, which is defined by the first to third pillar units P21 to P23 is relatively wider than the area of the spray hole which is defined by the fourth or fifth pillar unit P24 or P25. That is, when the shape of the upper surface of the pillar unit is curve-shaped between the pillar units having the same height, the area of the spray hole may become wider than the case where the shape of the upper surface of the pillar unit is of a straight type.

Figure 7:
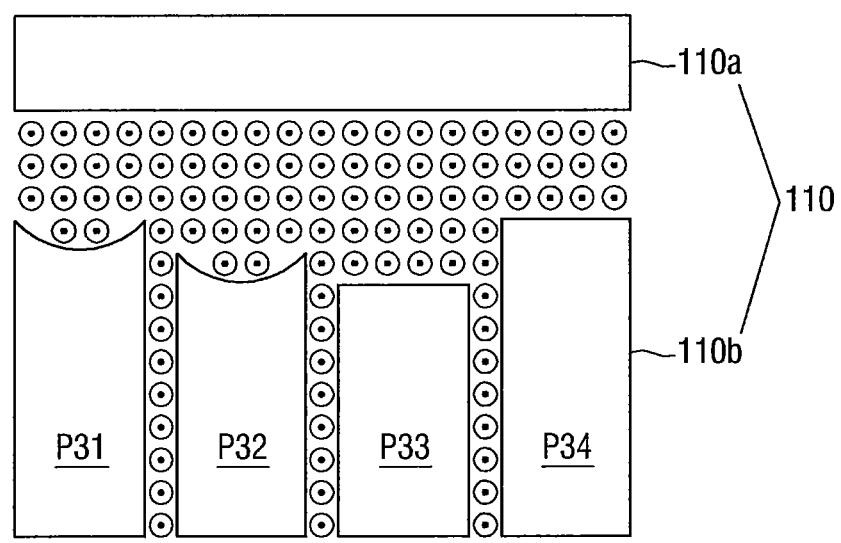
FIG. 7 is a cross-sectional view schematically illustrating a peripheral nozzle according to another embodiment of the present inventive concept.

FIG. 7 is a cross-sectional view schematically illustrating a peripheral nozzle according to another embodiment of the present inventive concept. What has already been described with reference to the peripheral nozzle according to an embodiment of the present inventive concept will be omitted here for the convenience of explanation and in the interest of brevity. Referring to FIG. 7, a peripheral nozzle 110 according to another embodiment of the present inventive concept may include a first or upper unit 110a and a second or lower unit 110b. At this time, the lower unit 110b may be composed of first to $n^{th}$ pillar units which may be respectively controlled independently. FIG. 7 illustrates a case where "n" is 4, but the embodiment is not limited thereto.

The shapes of the plurality of spray holes of the peripheral nozzle 110 may be differently formed according to respective heights of the first to fourth pillar units P31 to P34 which form the lower unit 110b. That is, the respective heights of the first to fourth pillar units P31 to P34 may be independently controlled, and the height of the pillar unit may be lowered in the area where the amount of flow of the processing gas (e.g., $H_2$ gas) may need to be increased. Respective heights of the first to fourth pillar units P31 to P34 may be controlled by using one or more actuators.

Further, the shapes of the upper surfaces of the first to fourth pillar units P31 to P34 may be differently formed. For example, the upper surfaces of the first to second pillar units P31 and P32 may be curved or curve-shaped, and the upper surfaces of the third and fourth pillar units P33 and P34 may be flat, straight or straight-shaped. As the upper surface of the pillar unit becomes curve-shaped, the area of the spray hole may relatively increase, and even if the height of the pillar unit is not adjusted, the amount of flow of the processing gas (e.g., $H_2$ gas) may relatively increase.

Further, the first to fourth pillar units P31 to P34 may be placed away or spaced apart from each other. That is, when respective heights of the first to fourth pillar units P31 to P34 are adjusted, the wear by friction between neighboring pillar units is prevented, and the first to fourth pillar units P31 to P34 may be placed away or spaced apart from each other in order to help prevent the contamination of the collector mirror unit 100 as the particles, which may be generated by the friction between the neighboring pillar units, contact the collector mirror unit 100.

Hereinafter, the shape of the spray hole or passageway of the center nozzle 120 will be described.

Figure 8:
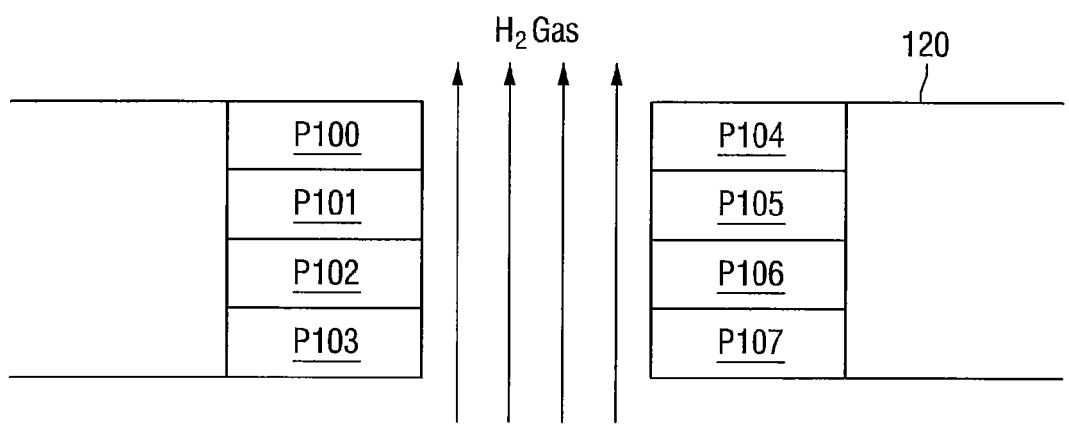
FIG. 8 is a cross-sectional view schematically illustrating a center nozzle according to an embodiment of the present inventive concept.
Figure 9:
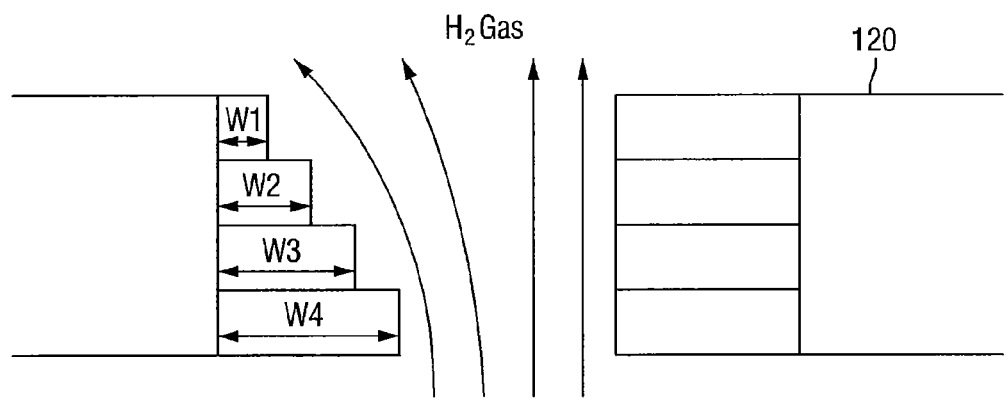
FIGS. 9 and 10 illustrate a method of operating a center nozzle according to an embodiment of the present inventive concept.
Figure 10:
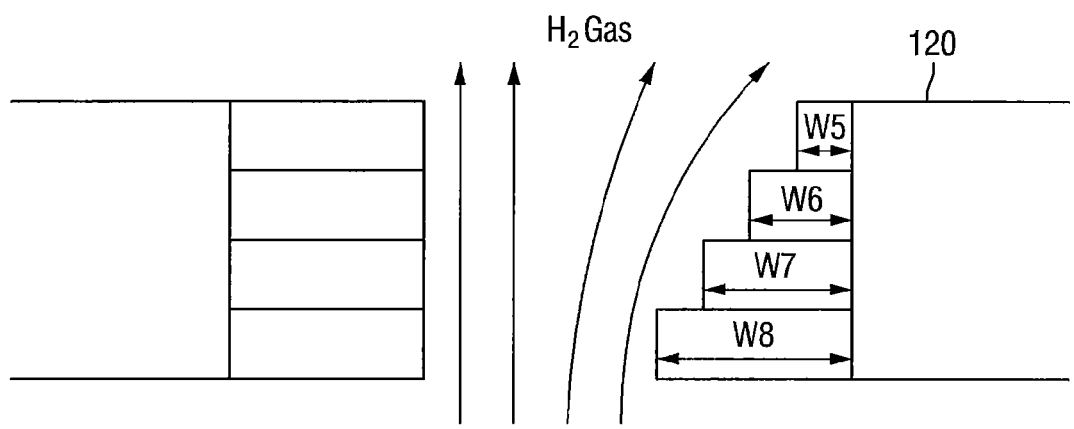

FIG. 8 is a cross-sectional view schematically illustrating a center nozzle according to an embodiment of the present inventive concept. FIGS. 9 and 10 illustrate a method of operating a center nozzle according to an embodiment of the present inventive concept.

Referring to FIGS. 8 to 10, the center nozzle 120 according to an embodiment of the present inventive concept, may be composed of first to nth pillar units or members which may be respectively controlled independently. Here, "n" refers to a natural number of 2 or more, and FIG. 8 illustrates a case where n is 8, but the embodiment is not limited thereto.

The shape of the spray hole of the center nozzle 120 may be differently formed according to respective widths W1 to W8 of the first to eighth pillar units P100 to P107. That is, widths W1 to W8 of the respective first to eighth pillar units P100 to P107 may be independently controlled, and if the amount of flow of the processing gas (e.g., $H_2$ gas) needs to be increased, the widths W1 to W8 of the first to eighth pillar units P100 to P107 may be reduced. As such, the area of the spray hole of the center nozzle 120 may increase, and the amount of flow of the processing gas (e.g., $H_2$ gas), which is supplied through the center nozzle 120, may increase.

The direction in which the processing gas (e.g., $H_2$ gas) is supplied may be adjusted by adjusting the widths W1 to W8 of the first to eighth pillar units P100 to P107 of the center nozzle 120. That is, referring to FIG. 9, the direction in which the processing gas (e.g., $H_2$ gas) is supplied, may be set to be tilted or curve to the left by adjusting the widths W1 to W4 of the first to fourth pillar units P100 to P103. Referring to FIG. 10, the direction in which the processing gas (e.g., $H_2$ gas) is supplied, may be set to be tilted or curve to the right by adjusting the widths W5 to W8 of the fifth to eighth pillar units P104 to P107.

In other words, the pillar units P100 to P107 may be extended and retracted to adjust the shape of the spray hole. The controller 500 may be configured to independently extend and retract the pillar units P100 to P107, for example, in response to the contamination level as measured by the sensing unit 400.

Figure 11:
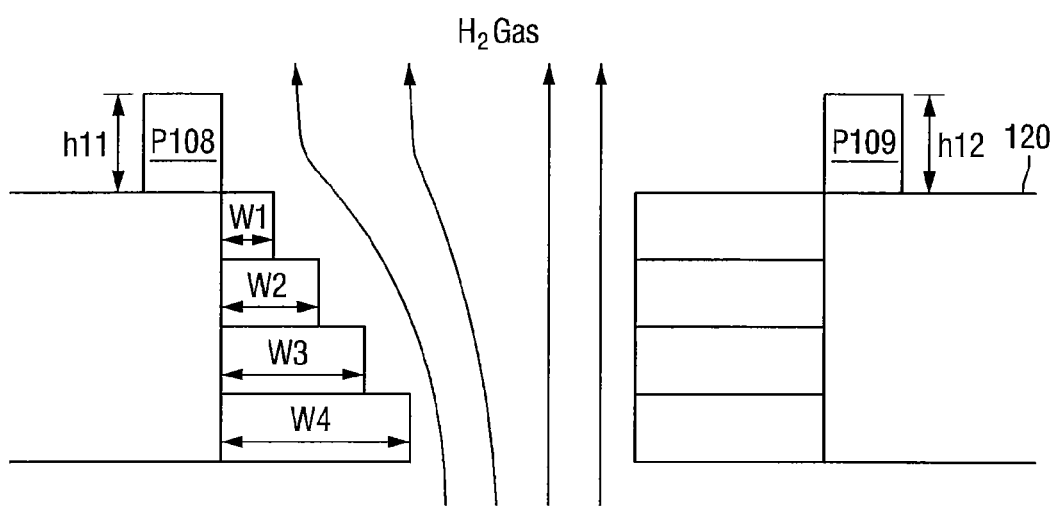
FIG. 11 is a cross-sectional view schematically illustrating a center nozzle according to another embodiment of the present inventive concept.

FIG. 11 is a cross-sectional view schematically illustrating a center nozzle according to another embodiment of the present inventive concept. What has already been described with reference to the center nozzle according to an embodiment of the present inventive concept will be omitted here for the convenience of explanation and in the interest of brevity.

Referring to FIG. 11, the center nozzle 120 according to another embodiment of the present inventive concept may be composed of first to $n^{th}$ pillar units or members which may be respectively controlled independently. Here, "n" is a natural number of 2 or more, and FIG. 11 illustrates a case where "n" is 10, but the embodiment is not limited thereto.

The shape of the spray hole of the center nozzle 120 may be differently formed according to respective widths W1 to W8 of the first to eighth pillar units P100 to P107 (see FIGS. 8 to 10). That is, respective widths W1 to W8 of the first to eighth pillar units P100 to P107 may be independently controlled, and if the amount of flow of the processing gas (e.g., $H_2$ gas) needs to increased, the widths W1 to W8 of the first to eighth pillar units P100 to P107 may be reduced. As such, the area of the spray hole of the center nozzle 120 may increase, and the amount of flow of the processing gas (e.g., $H_2$ gas), which is supplied through the center nozzle 120, may increase.

Further, the direction, in which the processing gas (e.g., $H_2$ gas) is supplied, may be adjusted by adjusting the widths W1 to W8 of the first to eighth pillar units P100 to P107. Further, the direction, in which the processing gas (e.g., $H_2$ gas) is supplied, may be adjusted by adjusting the respective heights h11 and h12 of the ninth and tenth pillar units P108 and P109.

If the height h11 of the ninth pillar unit P108 is lowered (e.g., relative to the height shown in FIG. 11), the amount of the processing gas, which is supplied to the area around the center nozzle 120, may increase. That is, the direction in which the processing gas is supplied and the amount of flow may be adjusted by adjusting the widths W1 to W8 of the first to eighth pillar units P100 to P107 and the heights h11 and h12 of the ninth and tenth pillar units P108 and P109.

Figure 12:
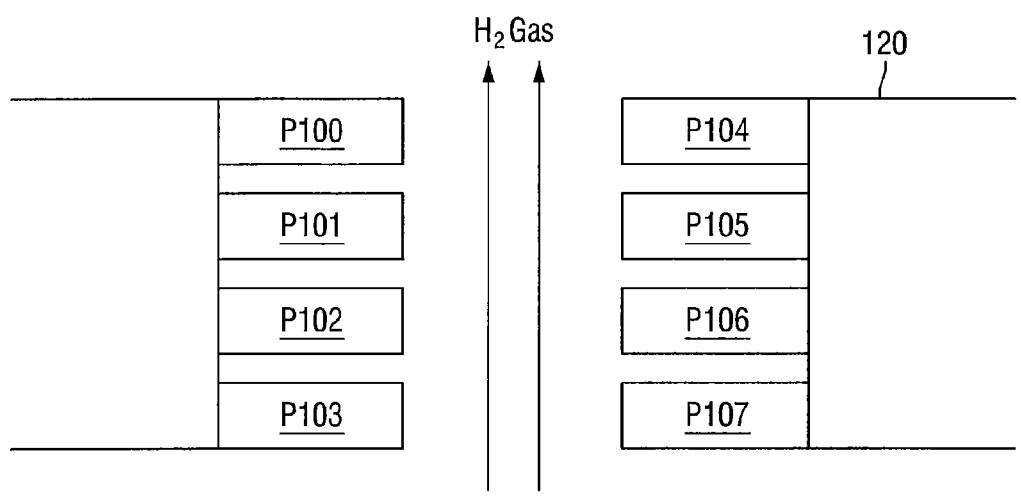
FIG. 12 is a cross-sectional view schematically illustrating a center nozzle according to another embodiment of the present inventive concept.

FIG. 12 is a cross-sectional view schematically illustrating a center nozzle according to another embodiment of the present inventive concept. What has already been described with reference to the center nozzle according to an embodiment of the present inventive concept will be omitted here for the convenience of explanation and in the interest of brevity.

Referring to FIG. 12, the center nozzle 120 according to another embodiment of the present inventive concept may be composed of first to $n^{th}$ pillar units or members which may be respectively controlled independently. Here, "n" is a natural number of 2 or more, and FIG. 12 illustrates a case where "n" is 8, but the embodiment is not limited thereto.

The shape of the spray hole of the center nozzle 120 may be differently formed according to respective widths W1 to W8 of the first to eighth pillar units P100 to P107 (see FIGS. 8 to 10). That is, respective widths W1 to W8 of the first to eighth pillar units P100 to P107 may be independently controlled, and if the amount of flow of the processing gas (e.g., $H_2$ gas) needs to increased, the widths W1 to W8 of the first to eighth pillar units P100 to P107 may be reduced. As such, the area of the spray hole of the center nozzle 120 may increase, and the amount of flow of the processing gas (e.g., $H_2$ gas), which is supplied through the center nozzle 120, may increase.

Further, the first to eighth pillar units P100 to P107 may be placed away or spaced apart from each other. That is, when respective heights of the first to eighth pillar units P100 to P107 are adjusted, the wear by friction between neighboring pillar units is prevented, and the first to eighth pillar units P100 to P107 may be placed away or spaced apart from each other in order to help prevent the contamination of the collector mirror unit 100 as the particles, which may be generated by the friction between the neighboring pillar units, contact the collector mirror unit 100.

It has been described above that the apparatus for generating extreme ultraviolet light according to the present inventive concept can adjust the shape of the spray hole of the peripheral nozzle 110 and/or the center nozzle 120 which have been arranged in the collector mirror unit 100 in order to adjust the amount of flow of the processing gas (e.g., $H_2$ gas) which is supplied to the collector mirror unit 100 and the direction of the processing gas (e.g., $H_2$ gas) which is supplied to the collector mirror unit 100.

However, it will be apparent to one of ordinary skill in the art that such a concept of the present inventive concept may be applied to any component which may generate contamination as the droplet deposits are stacked in the apparatus for generating the extreme ultraviolet light, and the concept may also be applied to the shape of the spray hole of the nozzle which supplies gases other than the above-described processing gas (e.g., $H_2$ gas).

Hereinafter, the method of using the apparatus for generating the extreme ultraviolet light according to an embodiment of the present inventive concept will be described.

Figure 13:
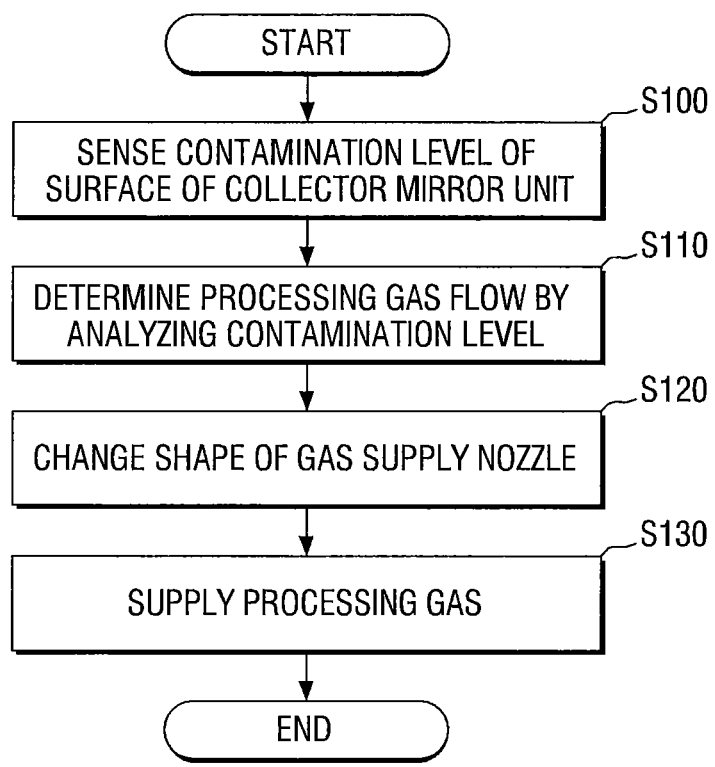
FIG. 13 is a flowchart illustrating a method of using an apparatus for generating extreme ultraviolet light according to an embodiment of the present inventive concept.

FIG. 13 is a flowchart sequentially illustrating a method of using an apparatus for generating extreme ultraviolet light according to an embodiment of the present inventive concept.

Referring to FIG. 13, the method of using the apparatus for generating extreme ultraviolet light according to an embodiment of the present inventive concept senses the contamination level of the surface of the collector mirror unit 100 (S100).

The collector mirror unit 100 is an apparatus which collects and reflects extreme ultraviolet light which is generated in the apparatus for generating extreme ultraviolet light. The contamination area of the surface of the collector mirror unit 100 may be non-uniformly formed according to the process state.

Then the contamination level of the surface of the collector mirror unit 100 is analyzed so as to determine the processing gas flow (S110). Here, the processing gas may be $H_2$ gas which is supplied to the surface of the collector mirror unit 100 and forms an air curtain, but the embodiment is not limited thereto.

Thereafter, the shape of the spray hole of the peripheral nozzle 110 or the center nozzle 120, which has been installed in the collector mirror unit 100, is changed (S120). The stacked distribution of the droplet deposits according to the surface area of the collector mirror unit 100 may become different, and thus the distribution of the contamination level may also become different. Hence, the amount of the processing gas supply may need to be increased for the area where the contamination level of the surface of the collector mirror unit 100 is high. As such, the area of the spray hole of the peripheral nozzle 110, which supplies the processing gas to an area where the contamination level of the surface of the collector mirror unit 100 is relatively high, may need to be increased, and the area of the spray hole of the peripheral nozzle 110 may be adjusted through the controller 500. At this time, the peripheral nozzle 110 may include a plurality of spray holes and respective shapes of the plurality of spray holes may be independently controlled.

Further, the area of the spray hole of the center nozzle 120 may also be adjusted so as to appropriately remove the droplet deposits.

Thereafter, the processing gas is supplied to the collector mirror unit 100 through the peripheral nozzle 110 or the center nozzle 120 (S130).

Figure 14:
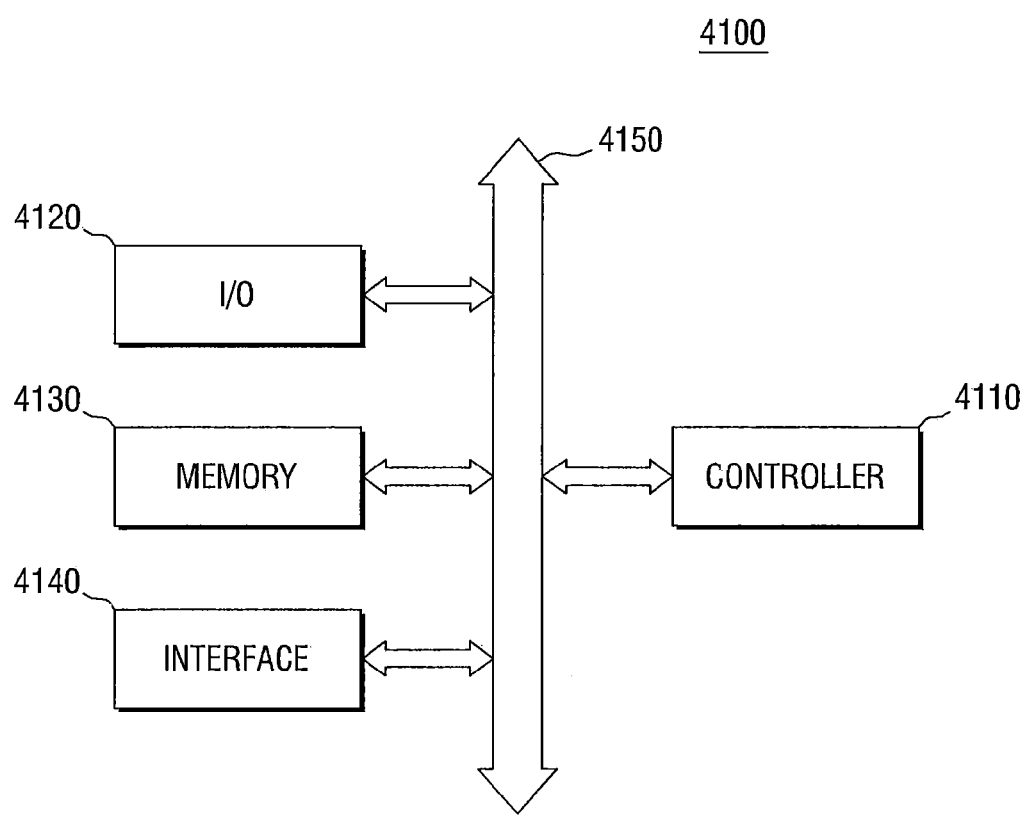
FIG. 14 is a block diagram of an electronic system including a semiconductor device which has been fabricated by using an apparatus for generating extreme ultraviolet light according to the present inventive concept.

FIG. 14 is a block diagram of an electronic system including a semiconductor device which has been fabricated by using an apparatus for generating extreme ultraviolet light according to the present inventive concept.

Referring to FIG. 14, an electronic system 4100 according to an embodiment of the present inventive concept may include a controller 4110, an input/output device 4120 (I/O), a memory device 4130, an interface 4140, and a bus 4150.

The controller 4110, the input/output device 4120, the memory device 4130, and/or the interface 4140 may be coupled through the bus 4150. The bus 4150 corresponds to a path in which data moves.

The controller 4110 may include at least one of a microprocessor, a digital signal processor, a microcontroller, and other logical devices capable of functions similar thereto.

The input/output device 4120 may include a keypad, a keyboard, and a display device.

The memory device 4130 may store data and/or commands, etc.

The interface 4140 may transmit data to a communication network or may receive data from the communication network. The interface 4140 may be wired or wireless. For example, the interface 4140 may include an antenna or a wired/wireless transceiver.

Though not illustrated, the electronic system 4100 may further include a high-speed DRAM and/or SRAM as an operation memory for enhancing the operation of the controller 4110. The semiconductor device, which has been fabricated by using the apparatus for generating ultraviolet light according to an embodiment of the present inventive concept may be provided within the memory device 4130 or may be provided as a part of the controller 4110, the input/output device 4120, etc.

The electronic system 4100 may be applied to a personal digital assistant (PDA), a portable computer, a web tablet, a wireless phone, a mobile phone, a digital music player, a memory card, or all electronic products capable of transmitting and/or receiving information in a wireless environment.

Figure 15:
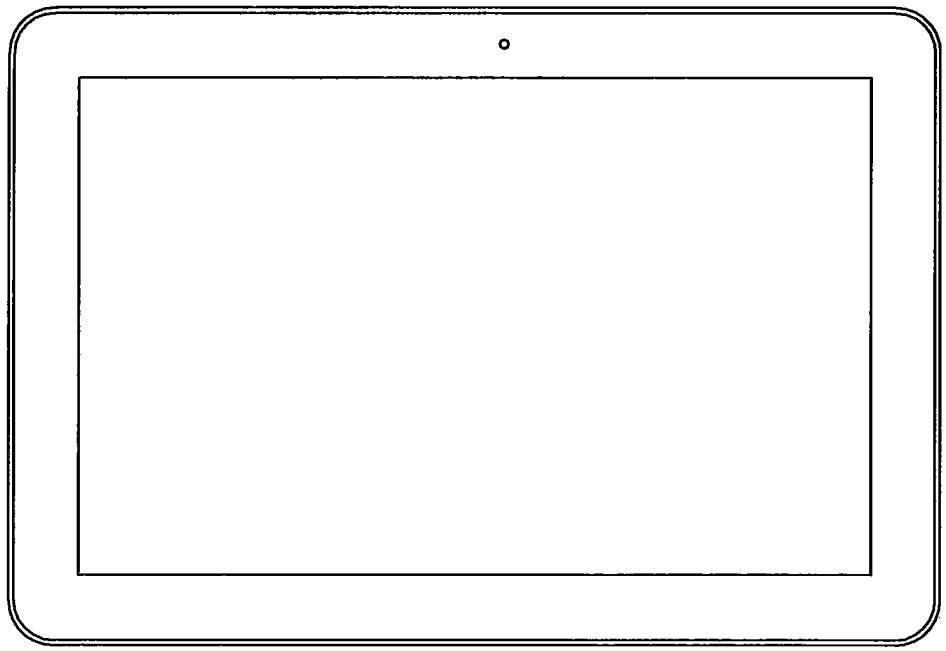
FIGS. 15 and 16 illustrate a semiconductor system which may apply a semiconductor device which has been fabricated by using an apparatus for generating extreme ultraviolet light according to the present inventive concept.
Figure 16:
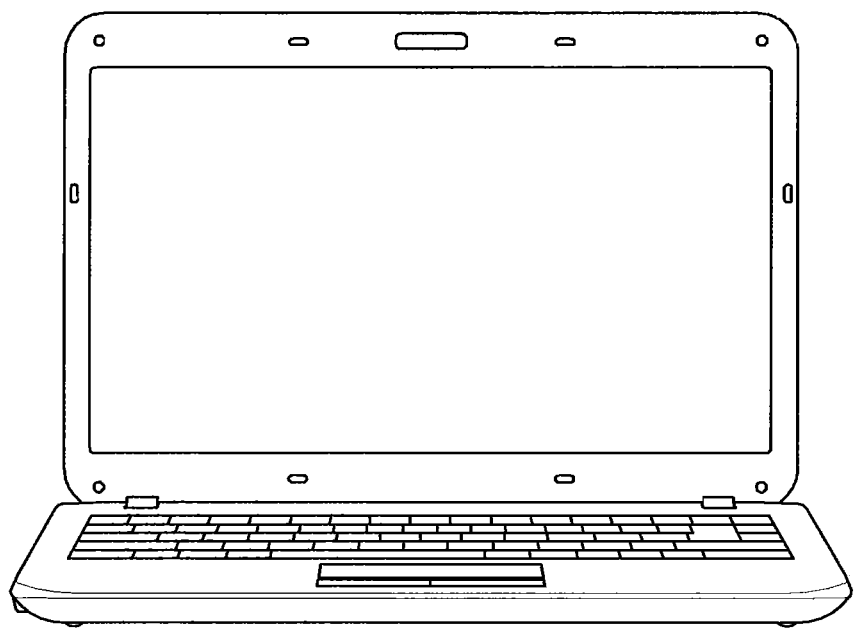

FIGS. 15 and 16 illustrate a semiconductor system which may apply a semiconductor device which has been fabricated by using an apparatus for generating extreme ultraviolet light according to the present inventive concept.

FIG. 15 illustrates a tablet PC and FIG. 16 illustrates a notebook computer. The semiconductor device, which has been fabricated by using the apparatus for generating extreme ultraviolet light according to an embodiment of the present inventive concept, may be used to a tablet PC, a notebook computer, etc. It will be apparent to one of ordinary skill in the art that the semiconductor device, which has been fabricated by using the apparatus for generating extreme ultraviolet light according to an embodiment of the present inventive concept, may also be applied to another integrated circuit device which has not been illustrated.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. An apparatus for generating extreme ultraviolet light, the apparatus comprising:
   a collector mirror unit;
   a gas supply unit configured to supply a processing gas to the collector mirror unit;
   a gas supply nozzle arranged in at least one area of the collector mirror unit and configured to supply the processing gas to a surface of the collector mirror unit to remove contamination from the surface of the collector mirror unit;
   a sensing unit configured to measure a contamination level of the surface of the collector mirror unit; and
   a controller configured to adjust a shape of a spray hole of the gas supply nozzle based on a result of measuring the contamination level by the sensing unit,
   wherein the shape of the spray hole is changed according to a control operation of the controller.

2. The apparatus of claim 1, wherein the gas supply nozzle includes a first gas supply nozzle arranged in a first area of the collector mirror unit and a second gas supply nozzle arranged in a second area of the collector mirror unit that is different than the first area of the collector mirror unit.

3. The apparatus of claim 2, wherein the first area is a peripheral area of the collector mirror unit, and the second area is a center area of the collector mirror unit.

4. The apparatus of claim 1, wherein the gas supply nozzle includes a plurality of spray holes.

5. The apparatus of claim 4, wherein the shape of the plurality of spray holes may be independently adjusted.

6. The apparatus of claim 1, wherein the processing gas includes $H_2$ gas.

7. An apparatus for generating extreme ultraviolet light, the apparatus comprising:
   a collector mirror unit;
   a gas supply unit configured to supply a processing gas to the collector mirror unit;
   a peripheral gas supply nozzle arranged at a peripheral area of the collector mirror unit and configured to supply the processing gas inwardly along a surface of the collector mirror unit to remove contamination from the surface of the collector mirror unit;
   a sensing unit configured to measure a contamination level of the surface of the collector mirror unit; and
   a controller configured to adjust a shape of a spray hole of the peripheral gas supply nozzle in response to the measured contamination level.

8. The apparatus of claim 7, wherein the peripheral gas supply nozzle comprises a fixed first unit and a second unit that each extend around the peripheral area of the collector mirror unit, and wherein the controller is configured to move at least a portion of the second unit away from and toward the first unit to thereby adjust the shape of the spray hole therebetween.

9. The apparatus of claim 8, wherein the second unit comprises a plurality of pillar members, and wherein the controller is configured to independently move the pillar members away from and toward the first unit.

10. The apparatus of claim 7, further comprising a central gas supply nozzle arranged at a central area of the collector mirror unit and configured to supply the processing gas therethrough, the central gas supply nozzle defining a spray hole, the central gas supply nozzle comprising a plurality of pillar members, wherein the controller is configured to extend and retract the pillar members to thereby adjust a shape of the spray hole of the central gas supply nozzle in response to the measured contamination level.

11. An apparatus for generating extreme ultraviolet light, the apparatus comprising:
- a vessel;
- a light source configured to supply a source light to an inside of the vessel;
- a droplet generation unit configured to supply a droplet to the source light which is provided to the inside of the vessel;
- a collector mirror unit arranged within the vessel and configured to collect and reflect extreme ultraviolet light which is generated by reaction between the source light and the droplet;
- a gas supply unit configured to supply processing gas to the collector mirror unit;
- a first gas supply nozzle arranged in a peripheral area of the collector mirror unit and supply the processing gas toward a center area of the collector mirror unit to remove contamination from a surface of the collector mirror unit;
- a second gas supply nozzle arranged in the center area of the collector mirror unit and configured to supply the processing gas therethrough;
- a sensing unit configured to measure a contamination level of the surface of the collector mirror unit; and
- a controller configured to adjust a shape of at least one of a first spray hole of the first gas supply nozzle and a second spray hole of the second gas supply nozzle, wherein the controller adjusts the shape of at least one of the first and second spray holes responsive to a result of measuring the contamination level by the sensing unit.

12. The apparatus of claim 11, wherein the first gas supply nozzle includes first to nth pillar units arranged along the peripheral area of the collector mirror unit, with n being a natural number of 2 or more, and the controller is configured to adjust the shape of the first spray hole by adjusting first to nth heights of the first to nth pillar units, respectively.

13. The apparatus of claim 12, wherein k is a natural number of 1 or more, and wherein an upper surface of the first to kth pillar units is curved and an upper surface of the (k+1)th to nth pillar units is straight.

14. The apparatus of claim 12, wherein the first to nth pillar units are spaced apart from each other.

15. The apparatus of claim 12, wherein the first to nth heights may be independently adjusted.

16. The apparatus of claim 11, wherein the second gas supply nozzle includes first to nth pillar units, with n being a natural number of 2 or more, and the controller is configured to adjust the shape of the second spray hole by adjusting the first to nth widths of the first to nth pillar units, respectively.

17. The apparatus of claim 16, wherein the first to nth widths may be independently adjusted.

18. The apparatus of claim 9, wherein the plurality of pillar members are arranged around the peripheral area of the collector minor unit, and wherein the spray hole is at least partially defined between the first unit and a surface of each pillar member that faces the first unit.

19. The apparatus of claim 10, wherein the plurality of pillar members comprise a first set of pillar members on a first side of the spray hole of the central gas supply nozzle and a second set of pillar members on a second, opposite side of the spray hole of the central gas supply nozzle, and wherein the controller is configured to independently extend and retract the pillar members of the first set of pillar members and the pillar members of the second set of pillar members.

20. The apparatus of claim 12, wherein the first gas supply nozzle comprises a fixed member arranged along the peripheral area of the collector mirror unit and positioned above the first to nth pillar units, and wherein the first spray hole is at least partially defined between the fixed member and upper surfaces of the first to nth pillar units.

* * * * *